United States Patent
Boiron et al.

(10) Patent No.: US 8,688,317 B2
(45) Date of Patent: Apr. 1, 2014

(54) METHOD FOR DIAGNOSING THE OPERATION OF A DEVICE FOR CUTTING OFF AND CONNECTING A BATTERY FROM/TO THE ONBOARD POWER NETWORK OF A MOTOR VEHICLE

(75) Inventors: Daniel Boiron, Voisins le Bretonneux (FR); Masato Origuchi, Rambouillet (FR)

(73) Assignee: RENAULT s.a.s., Boulogne Billancourt (FR)

( * ) Notice: Subject to any disclaimer, the term of this patent is extended or adjusted under 35 U.S.C. 154(b) by 33 days.

(21) Appl. No.: 13/386,742

(22) PCT Filed: Jun. 4, 2010

(86) PCT No.: PCT/FR2010/051110
§ 371 (c)(1),
(2), (4) Date: Apr. 12, 2012

(87) PCT Pub. No.: WO2011/010026
PCT Pub. Date: Jan. 27, 2011

(65) Prior Publication Data
US 2012/0191294 A1 Jul. 26, 2012

(30) Foreign Application Priority Data
Jul. 24, 2009 (FR) .................................... 09 55218

(51) Int. Cl.
*G01R 31/327* (2006.01)
(52) U.S. Cl.
USPC ......................................... 701/33.8; 324/426

(58) Field of Classification Search
USPC .......... 701/33.8; 324/426, 429, 433; 320/132, 320/134, 162, 104, 116, 124; 903/903, 947
See application file for complete search history.

(56) References Cited

U.S. PATENT DOCUMENTS 6,211,681 B1 * 4/2001 Kagawa et al. ............... 324/426

FOREIGN PATENT DOCUMENTS

JP      2009 071898      4/2009

OTHER PUBLICATIONS

French Search Report issued on Mar. 31, 2010 in French Patent Application FR 0955218 filed on Jul. 24, 2009, pp. 1-2.
International Search Report issued on Oct. 29, 2010 in PCT/FR10/051110 filed on Jun. 4, 2010, pp. 1-2.

* cited by examiner

*Primary Examiner* — Marthe Marc-Coleman
(74) *Attorney, Agent, or Firm* — Oblon, Spivak, McClelland, Maier & Neustadt, L.L.P.

(57) ABSTRACT

A method for diagnosing operating condition of a device for cutting off and connecting a high-voltage bipolar battery from/to a bipolar onboard power network of a motor vehicle. The device includes a first power relay between a first terminal of the battery and a first terminal of the network, a second power relay between a second terminal of the battery and a second terminal of the network, and a serial arrangement of a third precharge relay and a precharge resistor, connected in parallel to the first power relay. The method: measures two voltages of the cutoff/connection device; compares the measured voltages with predetermined voltage values representing faults of the cutoff/connection device; and diagnoses a fault of a relay used on the result of the comparison.

13 Claims, 4 Drawing Sheets

METHOD FOR DIAGNOSING THE OPERATION OF A DEVICE FOR CUTTING OFF AND CONNECTING A BATTERY FROM/TO THE ONBOARD POWER NETWORK OF A MOTOR VEHICLE

FIELD OF THE INVENTION

The invention relates to the field of the supply of automobile vehicle onboard power networks, to a battery of accumulators, and more particularly to the diagnosis of the operating state of the relays providing the bipolar disconnection and the connection of the onboard power network and the battery.

PRIOR ART

In an electric or hybrid automobile vehicle, the battery of accumulators supplies a high voltage, conventionally higher than 60V, to an onboard high voltage power network of the vehicle, namely all of the electricity-consuming components powered by the battery. Owing to the high voltage supplied by the battery, the disconnection of the latter, for example when the vehicle switches to a parking mode, must be bipolar, in other words the two terminals of the battery must be disconnected from the onboard power network. Such a bipolar disconnection of the battery indeed allows:

- the high voltage onboard power network to be automatically isolated from the battery in the case of a technical incident likely to damage the components of the onboard power network or to be detrimental to the safety of the users of the vehicle;
- in parking mode, the discharge of the battery by leakage currents to be avoided; and
- the duration of application of the high voltage to the onboard power network to be limited only to the effective period of use of the battery, and thus the lifetime of the components of the onboard power network to be improved, which components are subjected as little as possible to the high voltage and the associated electrical demands, including in the case of a simple failure of the components providing this disconnection.

The bipolar disconnection of the battery must furthermore satisfy electrical constraints in order to preserve both the components implementing said disconnection and the components of the onboard power network, notably as regards the transient phases of connection and of disconnection. More particularly:

- the current should be limited during the disconnection and the connection of the battery to the onboard power network in order not to stress the components of the latter, such as capacitors for example, and not to stress the disconnection and connection components themselves;
- the operating state of the disconnection and connection components, conventionally power relays, should be diagnosed and thus any propagation of the fault in the latter to the onboard power network is avoided;
- the number of operations of the disconnection and connection components, conventionally power relays, should be minimized in order to optimize their lifetime, notably that of the relay contacts; and
- the measurement of the voltage of the high-voltage battery with zero current should be allowed in order notably to estimate the state of charge of the latter as is required in the management of an electric or hybrid vehicle battery.

Figure 1:
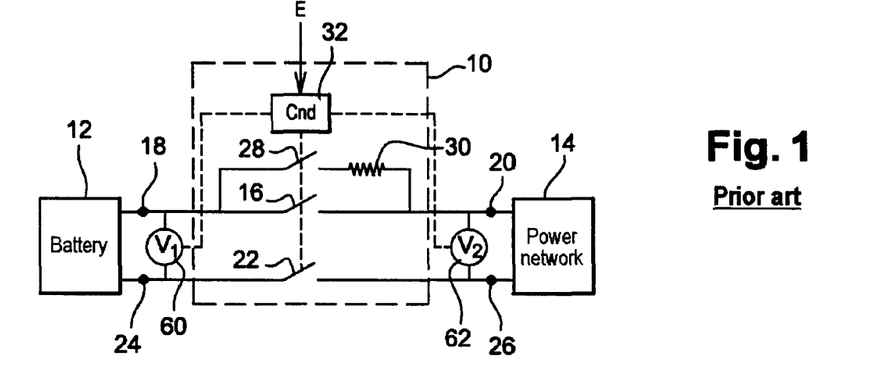
FIG. 1 is a schematic view of a device of the prior art for disconnection and connection of a battery from/to an onboard power network of an automobile vehicle, described in the introduction.

FIG. 1 is a schematic view of a prior art device 10 for disconnection and connection between a high-voltage battery of accumulators 12 and an onboard high-voltage power network 14, designed with a view to satisfying the conditions described hereinabove.

The disconnection and connection device 10 comprises:

- a first power relay 16 connected between a first terminal 18 of the battery 12 and a first terminal 20 of the power network 14;
- a second power relay 22, connected between the second terminal 24 of the battery and the second terminal 26 of the power network;
- a pre-charging line comprising a third relay 28 and a resistor 30 connected in series between the first terminals 18, 20 of the battery and of the power network; and
- a control module 32 commanding the opening and the closing of the relays 16, 22, 28 according to predetermined sequences, as is explained hereinafter.

Figure 2:
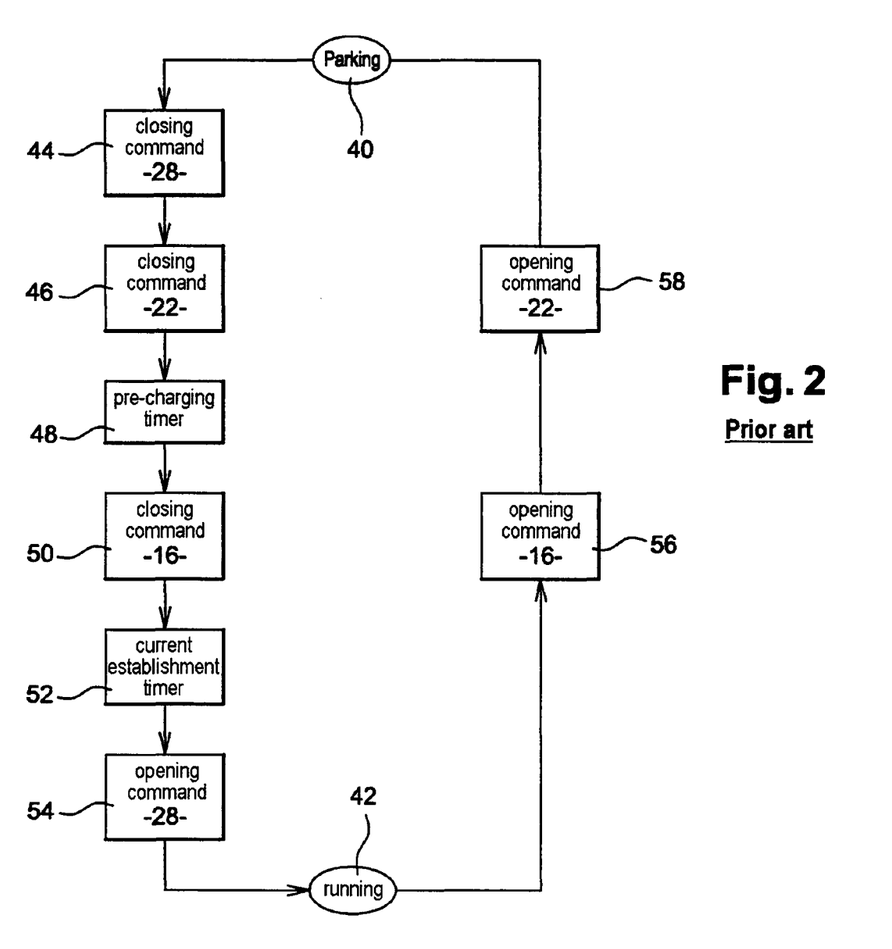
FIG. 2 is a flow diagram of the opening and closing sequences of the device in FIG. 1, described in the introduction.

FIG. 2 is a flow diagram illustrating the opening and closing sequences of the relays 16, 22, 28 implemented by the control module 32 allowing the vehicle to go from parking mode (when the battery 12 is disconnected from the onboard power network 14) to running mode (when the battery 12 is connected to the onboard power network 14).

In order to go from parking mode 40, in which the three relays 16, 22, 28 are open, to running mode 42 in which the first and second relays 16, 22 are closed and the third relay 28 open, a command for closing the third relay 28 is first of all produced at 44 by the module 32, then the latter commands the closing of the second relay 22 at 46. A timer is then activated at 48 in order to give the pre-loading of the onboard power network 14 time to finish.

Once the onboard power network has been pre-loaded, at 50, the module 32 commands the first relay 16 to close, then a timer is activated at 52 to give the current time to get established in the onboard power network 14, this timer being notably longer than the duration of the bounces of the first relay 16. Once the current is established in the onboard power network, the module 32 produces, at 54, a command for opening the third relay 28, the vehicle then being in running mode 42.

In order to go from running mode 42 to parking mode 40, the module 32 first of all sends, at 56, a command for opening the first relay 16, then a command for opening the second relay 22 at 58.

The sequences that have just been described for going from one mode of operation to another are those which minimize the number of opening and closing operations of the relays. They are therefore, in practice, favored for preserving the relays 16, 22, 28 and thus optimizing their lifetime.

Referring once again to FIG. 1, conventionally in order to diagnose a fault in the disconnection and connection device 10, in which a relay may for example remain stuck in its open or closed state, a first voltmeter 60 (FIG. 1) is installed between the terminals 18, 24 of the battery 12 and a second voltmeter 62 is installed between the terminals 20, 26 of the onboard power network 14, the voltmeters 60, 62 being for example connected to the control module 32 which implements a diagnostic procedure based on the voltages measured by the latter.

Although the processing of the measured voltages effectively allows certain faults to be diagnosed, such as for example the sticking of the first relay 16 in its closed state when the measured voltages by the first and the second voltmeters 60, 62 are equal to the voltage across the terminals of the battery 12 (measured by the first voltmeter 60 when the vehicle is in parking mode) following a command for opening the first relay 16 (step 56 in the sequence for disconnection of the battery), it is not however possible to diagnose some faults in time. More particularly, when the second relay 22 is stuck in its closed state, this fault can only be diagnosed when the vehicle goes from parking mode to start-up. In fact, the bipolar disconnection of the battery 12 may not happen for a long time (the time spent in parking mode) before this fault is detected, which can be damaging for both the battery 12 and the onboard power network 14 for the reasons mentioned hereinabove.

SUMMARY OF THE INVENTION

The aim of the present invention is to solve the aforementioned problem by providing a method for diagnosing the operating state of the relays in the disconnection and connection device, which allows the faults affecting the bipolar disconnection of the battery to be determined with a minimum of measurements and without modifying the opening and closing sequences of said relays.

For this purpose, one subject of the invention is a method for diagnosing the operating state of a disconnection and connection device for a bipolar high-voltage battery of accumulators from/to a bipolar onboard power network of an automobile vehicle, said device comprising a first power relay installed between a first terminal of the battery and a first terminal of the power network, a second power relay installed between a second terminal of the battery and a second terminal of the power network, and a serial connection of a third pre-charging relay and a pre-charging resistor, connected in parallel with the first power relay, said method comprising:
- the measurement of two voltages on the disconnection and connection device;
- the comparison of the measured voltages with predetermined values of voltage representative of faults in the disconnection and connection device; and
- the diagnosis of a fault in a relay depending on the result of the comparison.

According to the invention, the measured voltages are a first voltage between the first terminal of the battery and the terminal of the second relay installed on the onboard power network side and a second voltage between the first and second terminals of the onboard power network.

In other words, these voltages together comprise the information needed for the diagnosis of the faults impacting the bipolar disconnection of the battery without the vehicle having to be in parking mode.

According to particular embodiments of the invention, the method comprises one or more of the following features:
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the first relay is diagnosed as being in a continuously closed state if, after a command for opening the latter, the first and second measured voltages are substantially equal to the open-circuit voltage of the battery,
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the second relay is diagnosed as being in a continuously closed state if, after a command for opening the latter, the first measured voltage is substantially equal to the open-circuit voltage of the battery and the second measured voltage is substantially zero,
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the third relay is diagnosed as being in a continuously closed state if, after a command for opening the first relay, the first measured voltage is substantially equal to the open-circuit voltage of the battery and the second voltage is positive and less than the open-circuit voltage of the battery,
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the first relay is diagnosed as being in a continuously open state if, after a command for opening the third relay, the first measured voltage is substantially equal to the open-circuit voltage of the battery and if the second measured voltage is decreasing,
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the third relay is diagnosed as being in a continuously open state if, after a command for opening for closing of the latter relay, the first measured voltage is substantially equal to the open-circuit voltage of the battery and if the second measured voltage is substantially zero,
- during the use of the vehicle by the driver:
  the connection of the battery to the onboard power network consists consecutively in the closing of the second relay, the closing of the third relay, the closing of the first relay and the opening of the third relay;
  the disconnection of the battery from the onboard power network consists consecutively in the opening of the first relay and the opening of the second relay,
  and the second relay is diagnosed as being in a continuously open state or else the terminals of the battery are diagnosed as open circuit if, after a command for closing the second relay, the first and the second measured voltages are substantially zero,
- a maintenance sequence for the vehicle consists consecutively, starting from a parking mode in which the first, second and third relays are open, in the closing of the second relay, the closing of the third relay, the closing of the first relay, the opening of the third relay, the opening of the first relay and the opening of the second relay, and the second relay is diagnosed as being continuously closed if, in parking mode, the first measured voltage is substantially equal to the open-circuit voltage of the battery and the second measured voltage is substantially zero, a maintenance sequence for the vehicle consists consecutively, starting from a parking mode in which the first, second and third relays are open, in the closing of the second relay, the closing of the third relay, the closing of the first relay, the opening of the third relay, the opening of the first relay and the opening of the second relay, and the second relay is diagnosed as being continuously open or else the terminals of the battery are diagnosed as being in open circuit if, after a command for closing the second relay, the first and second measured voltages are substantially zero, the method furthermore comprises the measurement of the voltage across the terminals of the second relay in order to know which of the terminals of the battery or of the second relay is open circuit, a maintenance sequence for the vehicle consists consecutively, starting from a parking mode in which the first, second and third relays are open, in the closing of the second relay, the closing of the third relay, the closing of the first relay, the opening of the third relay, the opening of the first relay and the opening of the second relay, and the third relay is diagnosed as being continuously closed if, after a command for closing the second relay, the first measured voltage is substantially equal to the open-circuit voltage of the battery and the second measured voltage increases up to the open-circuit voltage of the battery, a maintenance sequence for the vehicle consists consecutively, starting from a parking mode in which the first, second and third relays are open, in the closing of the second relay, the closing of the third relay, the closing of the first relay, the opening of the third relay, the opening of the first relay, and the third relay is diagnosed as being continuously open if, after a command for closing the third relay, the first measured voltage is substantially equal to the open-circuit voltage of the battery and the second measured voltage is substantially zero, a maintenance sequence for the vehicle consists consecutively, starting from a parking mode in which the first, second and third relays are open, in the closing of the second relay, the closing of the third relay, the closing of the first relay, the opening of the third relay, the opening of the first relay and the opening of the second relay, and the first relay is diagnosed as being continuously open if, after a command for opening the third relay, the first measured voltage is substantially equal to the open-circuit voltage of the battery and the second measured voltage is decreasing.

BRIEF DESCRIPTION OF THE FIGURES

The invention will be better understood upon reading the description that follows, presented purely by way of example and in relation to the appended drawings, in which identical references denote identical or analogous elements, and in which.

DETAILED DESCRIPTION OF THE INVENTION

Figure 3:
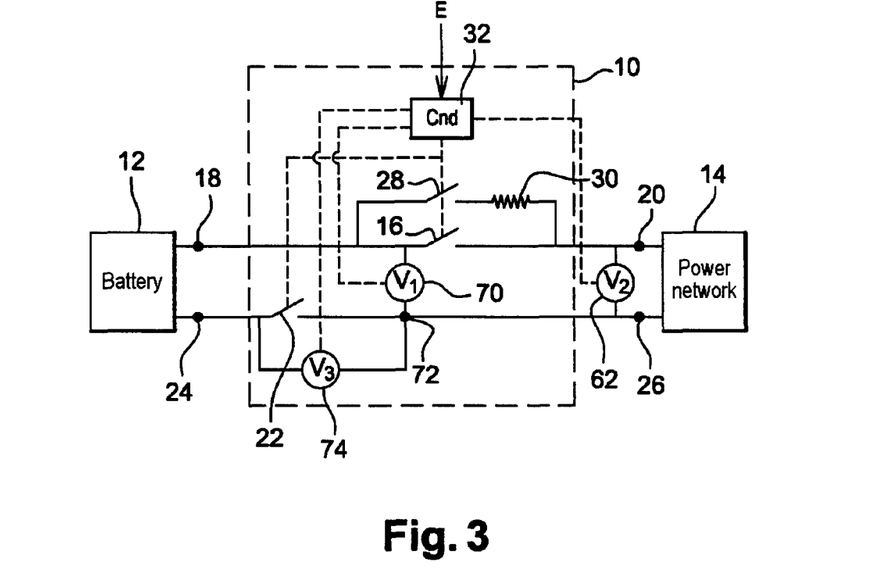
FIG. 3 is a schematic view illustrating the voltage measurements according to the invention.

FIG. 3 illustrates the voltage measurements carried out according to the invention, the device 10 for disconnection and connection of the battery 12 from/to the onboard power network 14 being identical to that in FIG. 1.

According to the invention, a first voltage measurement is carried out by a voltmeter 70 between the first terminal 18 of the battery 12 and the second terminal 26 of the onboard power network, in other words between the first terminal 18 of the battery and the terminal of the second relay 22 installed on the onboard power network 14 side. A second voltage measurement is furthermore performed by a voltmeter 62 between the terminals 20, 26 of the onboard power network. Finally, optionally, a third voltage measurement is effected by a voltmeter 74 across the terminals of the second relay 22.

Figure 4:
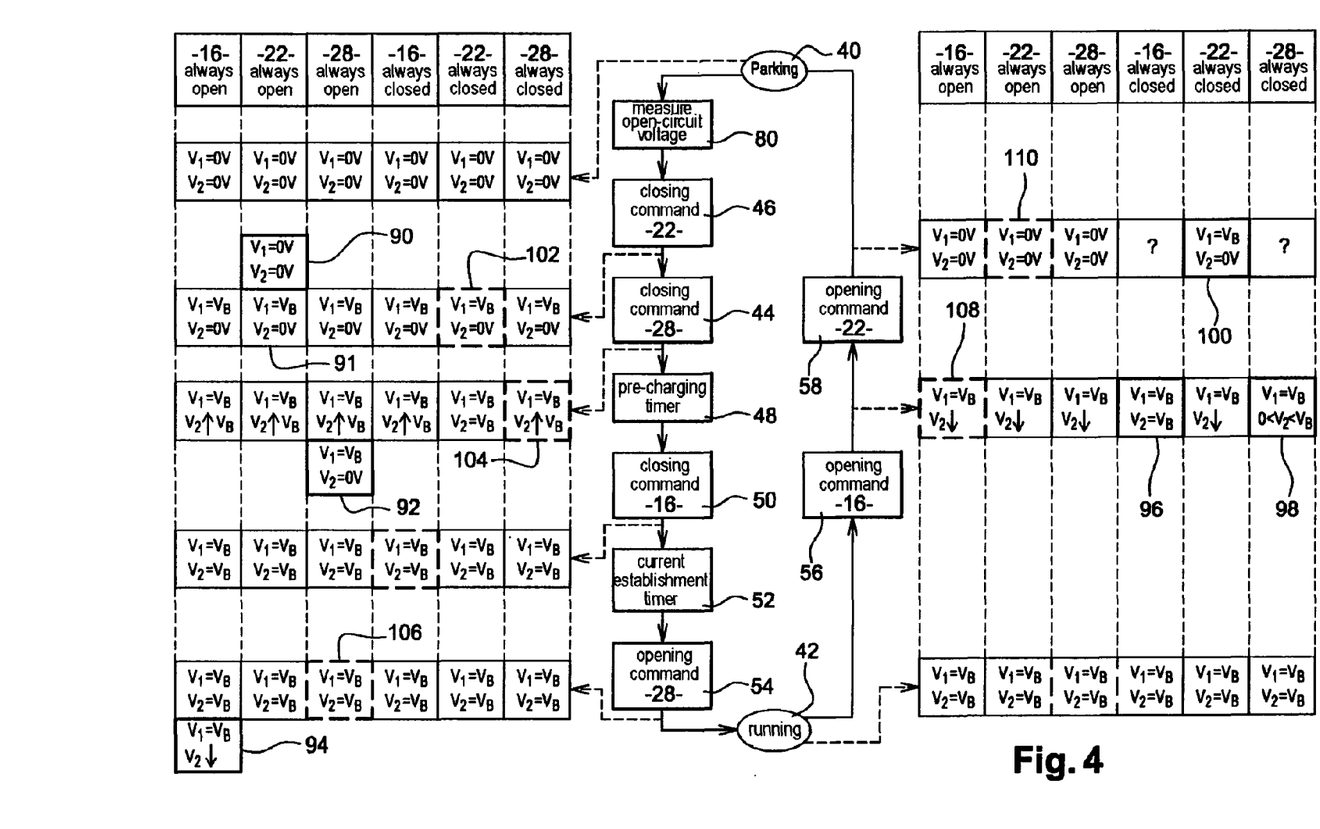
FIG. 4 is a flow diagram of the opening and closing sequences of the relay associated with a table for diagnosing the faults according to the invention depending on the voltage measurements illustrated in FIG. 3.

FIG. 4 is a flow diagram illustrating the opening and closing sequences of the relays 16, 22, 28 implemented by the control module 32 enabling the vehicle to go from parking mode to running mode. According to the invention, the opening and closing sequences differ from those described in relation to FIG. 2 in that the commands for closing 46, 44 of the second and third relays 22, 28 are reversed. Furthermore, a step 80 for measurement of the open-circuit voltage $V_B$ of the battery 12, in other words the voltage across the terminals 18, 24 of the latter when said terminals are in open circuit as is the case in parking mode, is provided prior to the sequence for closing of the relays for the transition into running mode.

FIG. 4 also illustrates the values taken, after each opening or closing command from the control module 32, by the voltage $V_1$, measured by the first voltmeter 70, and by the voltage $V_2$, measured by the second voltmeter 62, in the presence of faults in the relays 16, 22, 28, namely the first relay 16 stuck in the open position, or the second relay 22 stuck in the open position, or the third relay 28 stuck in the open position, or the first relay 16 stuck in the closed position, or the second relay 22 stuck in the closed position, or the third relay 28 stuck in the closed position. The symbol "↑" symbolizes an increasing voltage and the symbol "↓" symbolizes a decreasing voltage. Thus, for example, the expression "$V_1 \downarrow V_B$" signifies that the voltage $V_1$ is decreasing down to the value $V_B$. Furthermore, for the same state of opening and of closing of the relays, the voltages $V_1$ and $V_2$ can sometimes take different values, which is symbolized by two blocks placed one above the other, such as for example the blocks 90 and 91.

With the aid of the measured voltages $V_1$ and $V_2$ and the comparison of these with values representative of predetermined faults in the relays 16, 22, 28 of the disconnection and connection device, the control module 32 diagnoses said faults.

More particularly:

when, following the command for closing the second switch 22 at 46, the voltages $V_2$ and $V_2$ are substantially zero (block 90), the module 32 diagnoses that the second relay 22 is stuck in its open state or that the terminals of the battery 12 are in open circuit;

when, following the command for closing the third relay 28 at 44, the voltage $V_1$ is substantially equal to the voltage $V_B$ and the voltage $V_2$ is substantially zero (block 92), the module 32 diagnoses that the third relay 28 is stuck in its open state;

when, following the command for opening the third relay 28 at 54, the voltage $V_1$ is substantially equal to the voltage $V_B$ and the voltage $V_2$ is decreasing (block 94), the module 32 diagnoses that the first relay 16 is stuck in its open state;

when, following the command for opening the first relay 16 at 56, the voltages $V_1$ and $V_2$ are substantially equal to the voltage $V_B$ (block 96), the module 32 diagnoses that the first relay 16 is stuck in its closed state;

when, following the command for opening the first relay 16 at 56, the voltage $V_1$ is substantially equal to the voltage $V_B$ and the voltage $V_2$ is in the range between 0 and $V_B$ (block 98), the module 32 diagnoses that the third relay 28 is stuck in its closed state;

when, following the command for opening the second relay 22 at 58, the voltage $V_1$ is substantially equal to the voltage $V_B$ and the voltage $V_2$ is substantially zero (block 100), the module 32 diagnoses that the second relay 22 is stuck in its closed state.

As can be observed, the faults in the relays are detected at the earliest before the vehicle has even gone into parking mode. Thus, for example, during the opening sequence to set the vehicle into parking mode, if the voltages $V_1$ and $V_2$ are substantially equal, then the first relay 16 is stuck in its closed state, and if the voltage $V_2$ is less than the voltage $V_1$, then the third relay 28 is stuck in its closed state.

In the case where it would be necessary to distinguish whether the second relay 22 is in its open state or the terminals of the battery 12 are in open circuit (block 90), the voltage measurement by the third voltmeter 74 allows this uncertainty to be lifted.

Furthermore, it is possible to determine even earlier that a fault has occurred in the disconnection and connection device 10, without however determining the exact nature of said fault.

More particularly, a fault in the module 10 is diagnosed, without at this stage said fault having any functional, and hence critical, effect on the operation of the latter or of the components of the onboard power network:

when, following the command for closing the second relay 22 at 46, the voltage $V_1$ is substantially equal to the voltage $V_B$ and the voltage $V_2$ is substantially zero (block 102);

when, following the command for closing the third relay 28 at 44, the voltage $V_1$ is substantially equal to the voltage $V_B$ and the voltage $V_2$ increases up to the voltage $V_B$ (block 104);

when, following the command for opening the third relay 28 at 54, the voltages $V_1$ and $V_2$ are substantially equal to the voltage $V_B$ (block 106);

when, following the command for opening the first relay 16 at 56, the voltage $V_1$ is substantially equal to the voltage $V_B$ and the voltage $V_2$ is decreasing (block 108);

when, following the command for opening the second relay 22 at 56, the voltages $V_1$ and $V_2$ are substantially zero (block 110).

When a fault in the disconnection and connection device 10 is diagnosed, the driver of the vehicle is warned of this, for example by means of the illumination of an indicator lamp on the dashboard of the vehicle, inviting the latter to carry out a repair or an exchange of the disconnection and connection device 10.

Once in for repair, a sequence for opening and closing of the relays 16, 22, 28, referred to as a "maintenance sequence", can be implemented in order to reproduce the fault in a relay which has been detected during the use of the vehicle by the driver and thus to confirm this diagnosis and, once the repair has been done, to check that the fault has gone.

Figure 5:
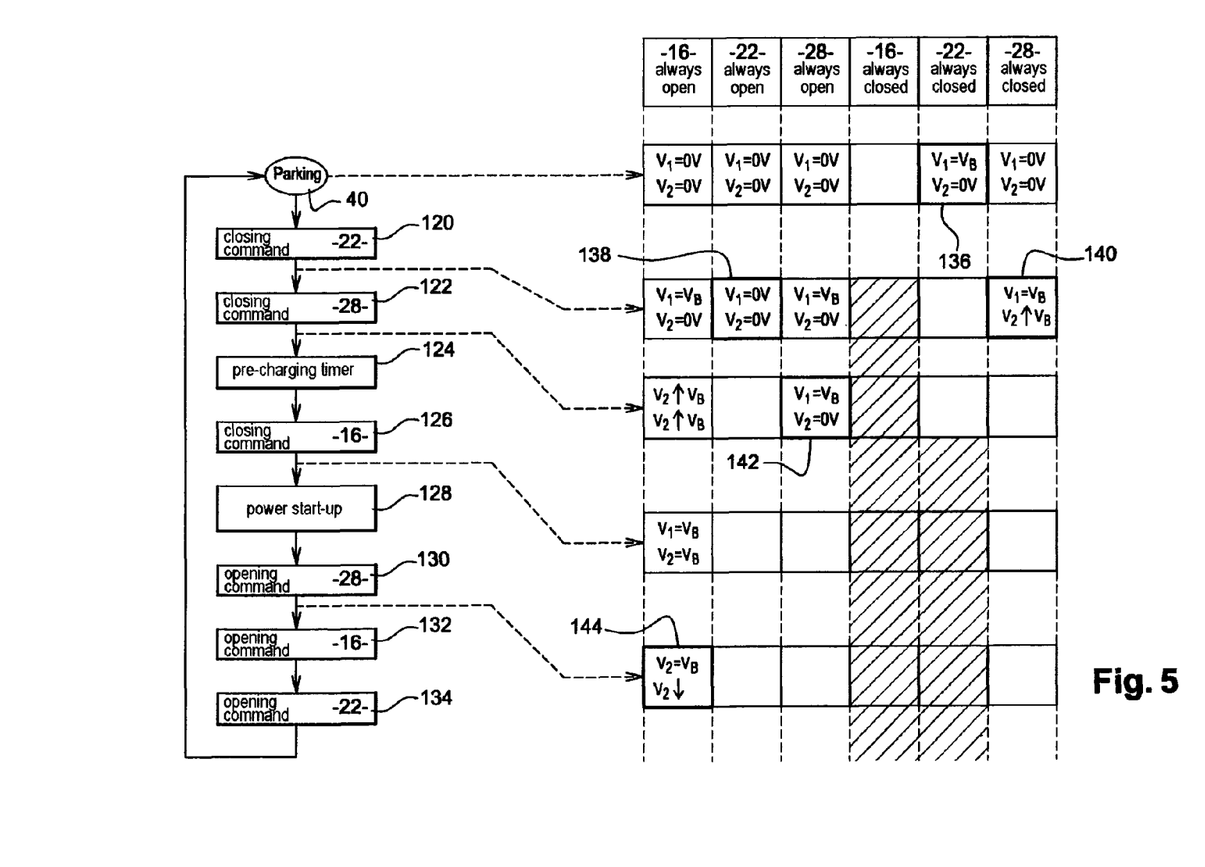
FIG. 5 is a flow diagram of a maintenance closing and opening sequence for the automobile vehicle associated with a table for diagnosing the faults according to the invention depending on the voltage measurements illustrated in FIG. 3.

Such a maintenance sequence is illustrated in FIG. 5 in association with the values taken by the measured voltages $V_1$ and $V_2$ during faults of the relays 16, 22, 28.

Starting from parking mode 40, a command for closing the second relay 22 is produced at 120 followed by a command for closing the third relay 28 at 122. Once a pre-loading timer has been implemented at 124, the maintenance sequence continues at 126 with a command for closing the first relay 126 then the electrical power is switched on at 128 such that the battery 12 is connected to the onboard power network 14 for powering the electrical traction system of the vehicle. A command for opening the third relay 28 is then produced at 130, followed by a command for opening the first relay 16 at 132 and by a command for opening the second relay 22 at 134. The vehicle then returns to its parking mode 40.

The control module 32 then implements the following diagnostic procedure:

in parking mode 40, if the voltage $V_1$ is substantially equal to the voltage $V_B$ and the voltage $V_2$ is substantially zero (block 136), the module 32 then diagnoses that the third relay 28 is stuck in its closed state;

when, following the command for closing the second relay 22 at 120, the voltages $V_1$ and $V_2$ are substantially zero (block 138), the module 32 diagnoses that the second relay 22 is stuck in its open state or else that the terminals of the battery 12 are in open circuit, the uncertainty in the fault being optionally lifted by making use of the measurement of the voltage across the terminals of the second relay 22 by the voltmeter 74;

when, following the command for closing the second relay 22 at 120, the voltage $V_1$ is substantially equal to the voltage $V_B$ and the voltage $V_2$ increases up to the voltage $V_B$ (block 140), the module 32 diagnoses that the third relay 28 is stuck in its closed state;

when, following the command for closing the third relay 28 at 122, the voltage $V_1$ is substantially equal to the voltage $V_B$ and the voltage $V_2$ is substantially zero (block 142), the module 32 diagnoses that the third relay 28 is stuck in its open state; and when, following the command for opening the third relay 28 at 130, the voltage $V_1$ is substantially equal to the voltage $V_B$ and the voltage $V_2$ is decreasing (block 144), the module 32 diagnoses that the first relay 16 is stuck in its open state.

Furthermore, when the first relay 16 has been diagnosed as stuck in its closed state, for example during the use of the vehicle by the driver, as described in relation to FIG. 4, the maintenance sequence composed of the steps 120 to 134 is preferably forbidden. This is because such a sequence, with the first relay 16 stuck in its closed state, would cause a rapid charging of the onboard power network 14, which would risk damaging other relays and the components of the onboard power network 14. For the same reasons, the sequence composed of the steps 126 to 134 is forbidden when the second relay 22 is stuck in its closed state.

These forbidden conditions can for example be managed by the control module 32 which saves in memory the diagnosed faults and inhibits by default the sequences that are dangerous for the various components and relays.

Thanks to the invention, a diagnosis of the operation of the disconnection and connection device is thus obtained, allowing the earliest possible detection, and especially before the vehicle goes into its parking mode, of the faults in the relays forming said device. Furthermore, this diagnosis does not add any additional step for opening or closing of said relays, thus preserving their lifetime.

The invention claimed is:

1. A method for diagnosing an operating state of a device for disconnection and connection of a bipolar high-voltage battery of accumulators from/to a bipolar onboard power network of an automobile vehicle, the device including a first power relay installed between a first terminal of the battery and a first terminal of the power network, a second power relay installed between a second terminal of the battery and a second terminal of the onboard power network, and a serial connection of a third pre-charging relay and a pre-charging resistor, connected in parallel with the first power relay, the method comprising:
measuring first and second voltages on the disconnection and connection device using first and second voltage measurement devices, respectively;
comparing, using a controller, the first and second measured voltages with predetermined values of voltage representative of faults in the disconnection and connection device; and
diagnosing, using the controller, a fault in any of the first power relay, the second power relay and the third pre-charging relay, depending on a result of said comparing,
wherein the first and second measured voltages are a first voltage between the first terminal of the battery and a first terminal of the second power relay on a side of the onboard power network and a second voltage between the first and second terminals of the onboard power network, respectively.

2. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay; and
disconnection of the battery from the onboard power network includes consecutively opening of the first power relay and opening of the second power relay,
wherein the first power relay is diagnosed as being in a continuously closed state when, after a command for opening the first power relay, the first and second measured voltages are substantially equal to an open-circuit voltage of the battery.

3. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay; and
disconnection of the battery from the onboard power network includes consecutively opening of the first power relay and opening of second power relay,
wherein the second power relay is diagnosed as being in a continuously closed state when, after a command for opening the second power relay, the first measured voltage is substantially equal to an open-circuit voltage of the battery and the second measured voltage is substantially zero.

4. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay; and
disconnection of the battery from the onboard power network includes consecutively opening of the first power relay and opening of the second power relay,
wherein the third pre-charging relay is diagnosed as being in a continuously closed state when, after a command for opening the first power relay, the first measured voltage is substantially equal to an open-circuit voltage of the battery and the second voltage is positive and less than the open-circuit voltage of the battery.

5. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay; and
disconnection of the battery from the onboard power network includes consecutively opening of the first power relay and opening of the second power relay,
wherein the first power relay is diagnosed as being in a continuously open state when, after a command for opening the third pre-charging relay, the first measured voltage is substantially equal to an open-circuit voltage of the battery and the second measured voltage is decreasing.

6. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay;
disconnection of the battery from the onboard power network includes consecutively opening of the first power relay and opening of the second power relay, and
wherein the third pre-charging relay is diagnosed as being in a continuously open state when, after a command for closing the third pre-charging relay, the first measured voltage is substantially equal to an open-circuit voltage of the battery and the second measured voltage is substantially zero.

7. The method as claimed in claim 1, wherein, during use of the automobile vehicle by a driver:
connection of the battery to the onboard power network includes consecutively closing of the second power relay, closing of the third pre-charging relay, closing of the first power relay, and opening of the third pre-charging relay;
disconnection of the battery from the onboard power network includes consecutively opening of the first power relay and opening of the second power relay, and
wherein the second power relay is diagnosed as being in a continuously open state or the first and second terminals of the battery are diagnosed as being an open circuit when, after a command for closing the second power relay, the first and the second measured voltages are substantially zero.

8. The method as claimed in claim 1,
wherein a maintenance sequence for the automobile vehicle includes consecutively, starting from a parking mode in which the first power relay, the second power relay, and the third pre-charging relay are open, closing of the second power relay, closing of the third pre-charging relay, closing of the first power relay, opening of the third pre-charging relay, opening of the first power relay, and opening of the second power relay, and wherein the second power relay is diagnosed as being continuously closed when, in the parking mode, the first measured voltage is substantially equal to an open-circuit voltage of the battery and the second measured voltage is substantially zero.

9. The method as claimed in claim 1,
wherein a maintenance sequence for the automobile vehicle includes consecutively, starting from a parking mode in which the first power relay, the second power relay, and the third pre-charging relay are open, closing of the second power relay, closing of the third pre-charging relay, closing of the first power relay, opening of the third pre-charging relay, opening of the first power relay, and opening of the second power relay, and wherein the second power relay is diagnosed as being continuously open or the first and second terminals of the battery are diagnosed as being an open circuit when, after a command for closing the second power relay, the first and second measured voltages are substantially zero.

10. The method as claimed in claim 9, further comprising measuring a third voltage across the first terminal and a second terminal of the second power relay to determine which of the first and second terminals of the battery or of the first and second terminals of the second power relay are open circuit.

11. The method as claimed in claim 1,
wherein a maintenance sequence for the automobile vehicle includes consecutively, starting from a parking mode in which the first power relay, the second power relay, and the third pre-charging relay are open, closing of the second power relay, closing of the third pre-charging relay, closing of the first power relay, opening of the third pre-charging relay, opening of the first power relay, and opening of the second power relay, and wherein the third pre-charging relay is diagnosed as being continuously closed when, after a command for closing the second power relay, the first measured voltage is substantially equal to an open-circuit voltage of the battery and the second measured voltage increases up to the open-circuit voltage of the battery.

12. The method as claimed in claim 1,
wherein a maintenance sequence for the automobile vehicle includes consecutively, starting from a parking mode in which the first power relay, the second power relay, and the third pre-charging relay are open, closing of the second power relay, closing of the third pre-charging relay, closing of the first power relay, opening of the third pre-charging relay, opening of the first power relay, and wherein the third pre-charging relay is diagnosed as being continuously open when, after a command for closing the third pre-charging relay, the first measured voltage is substantially equal to an open-circuit voltage of the battery and the second measured voltage is substantially zero.

13. The method as claimed in claim 1,
wherein a maintenance sequence for the automobile vehicle includes consecutively, starting from a parking mode in which the first power relay, the second power relay, and the third pre-charging relay are open, closing of the second power relay, closing of the third pre-charging relay, closing of the first power relay, opening of the third pre-charging relay, opening of the first power relay, and opening of the second power relay, and wherein the first power relay is diagnosed as being continuously open when, after a command for opening the third pre-charging relay, the first measured voltage is substantially equal to an open-circuit voltage of the battery and the second measured voltage is decreasing.

* * * * *